Dec. 29, 1959 D. C. TYLER 2,919,412
ELECTRIC OSCILLATOR SYSTEMS
Filed May 27, 1957
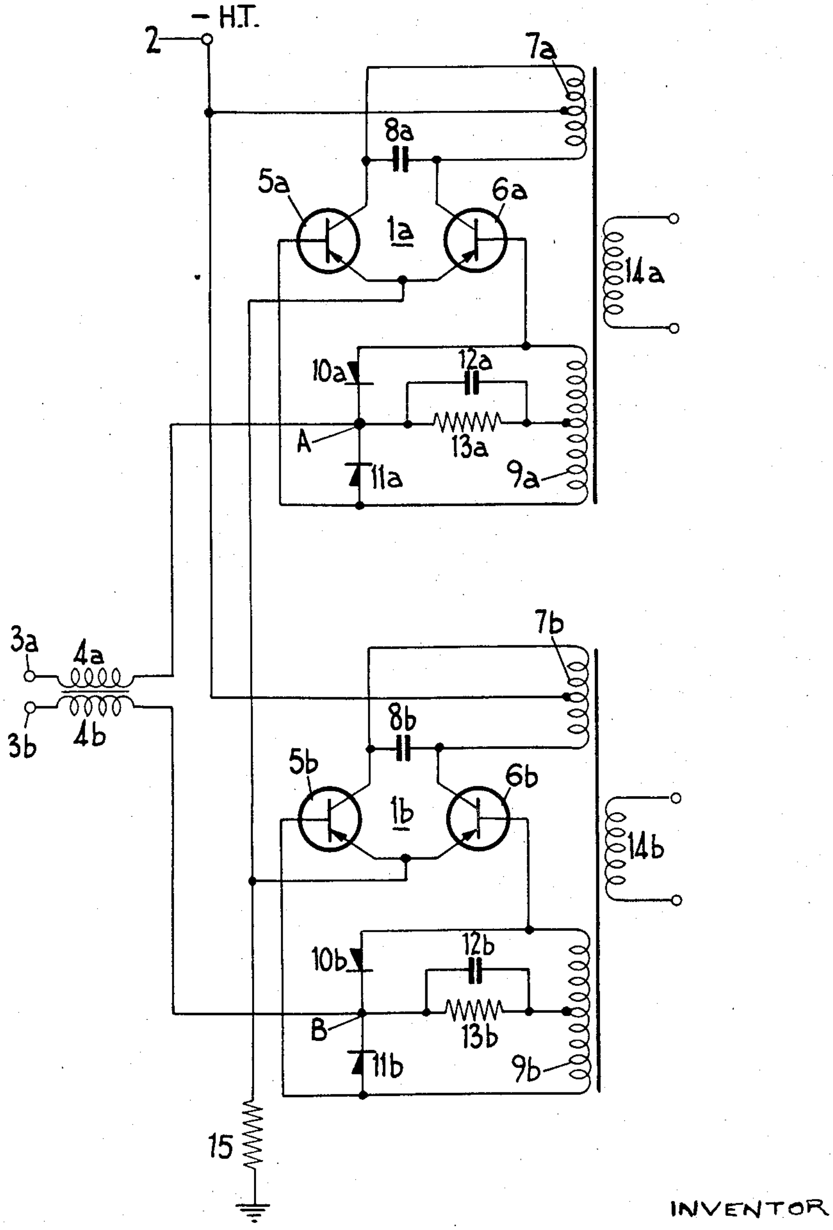
INVENTOR
DAVID CHARLES TYLER
BY
[signature]
ATTORNEYS United States Patent Office 2,919,412
Patented Dec. 29, 1959

2,919,412

ELECTRIC OSCILLATOR SYSTEMS

David Charles Tyler, near Rugby, England, assignor to The General Electric Company Limited, London, England Application May 27, 1957, Serial No. 661,630

Claims priority, application Great Britain May 29, 1956

4 Claims. (Cl. 331—52)

This invention relates to electric oscillator systems.

The invention is concerned in particular with electric oscillator systems of the kind comprising a plurality of oscillator circuits adapted to be selectively rendered operative by the application of suitable control voltages. Such systems may be used, for example, in vertain electric signalling and switching systems. In the use of such an oscillator system, it may be required that the transitions between different steady states of the system should be relatively rapid, but it may be difficult or inconvenient to provide control voltages in which the transitions are sufficiently rapid for this purpose.

It is consequently an object of the present invention to provide an electric oscillator system of the kind referred to in which the transitions between different steady states of the system may be appreciably more rapid than corresponding transitions in the control voltages applied to the system.

According to the invention, an electric oscillator system comprises a plurality of oscillator circuits adapted to be selectively rendered operative by the application of suitable control voltages, the oscillator circuits having in common an impedance element arranged so that when any of the oscillator circuits is operative there is developed across the impedance element a bias voltage which is applied to all the oscillator circuits in such a sense as to tend to restrain their operation.

Preferably each oscillator circuit includes an individual self-biassing arrangement, which, when the relevant oscillator circuit is operative, provides a bias voltage which tends to maintain that oscillator circuit in operation.

One electric oscillator system in accordance with the present invention will now be described by way of example; a circuit diagram of the system is shown in the accompanying drawing.

Referring to the drawing, the system comprises a pair of oscillator circuits 1*a* and 1*b* which are energised from a constant voltage source having a negative terminal 2 and a positive terminal (not shown) which is earthed. The oscillator circuits 1*a* and 1*b* are arranged to be rendered operative alternately in response to a pair of control voltages of similar quasirectangular waveform which are respectively applied in anti-phase to terminals 3*a* and 3*b*, the transitions in these control voltages occupying relatively long periods (say of the order of 20 milliseconds); each control voltage is superimposed upon a constant bias voltage which is negative with respect to earth and which has a magnitude greater than the amplitude of the control voltages. The voltages appearing at the terminals 3*a* and 3*b* are respectively applied via the windings 4*a* and 4*b* of a transformer to points A and B in the oscillator circuits 1*a* and 1*b*.

The oscillator circuit 1*a* includes a pair of P-N-P germanium junction transistors 5*a* and 6*a* connected in push-pull, feedback being provided by means of a transformer, having a primary winding 7*a* which is connected between the collector electrodes of the transistors 5*a* and 6*a* and is tuned by means of a capacitor 8*a*, and having a secondary winding 9*a* connected between the base electrodes of the transistors 5*a* and 6*a*. The oscillator circuit 1*a* also includes a self-biassing arrangement constituted by a full wave rectifier circuit connected so as to rectify the voltage appearing across the secondary winding 9*a* and incorporating a pair of rectifiers 10*a* and 11*a*, capacitor 12*a* and a resistor 13*a*; when the oscillator circuit 1*a* is operating, this self-biassing arrangement produces a substantially constant voltage across the resistor 13*a*, which is arranged to have a magnitude somewhat less than the amplitude of the control voltage applied to the terminal 3*a*. It will be seen that the base electrodes of the transistors 5*a* and 6*a* are biassed negatively with respect to earth by an amount equal to the sum of the voltage appearing at the point A and the voltage appearing across the resistor 13*a*. The feedback transformer of the oscillator circuit 1*a* has a further secondary winding 14*a* from which an output signal is derived. The oscillator circuit 1*b* is exactly similar to the oscillator circuit 1*a*, and will therefore not be described in detail, it being sufficient to note that the elements of the oscillator circuit 1*b* are given the same reference numerals as the corresponding elements of circuit 1*a*, but with suffixes "*b*" instead of "*a*." The emitter electrodes of all the transistors 5*a*, 5*b*, 6*a* and 6*b* are connected together to one end of a resistor 15 whose other end is earthed.

The operation of the oscillator system is as follows. It will be assumed initially that the control voltages are in a steady state in which the point A is more negative with respect to earth than the point B. For the sake of definiteness, it will be further assumed that in this condition of the system the potential of the point A is 5.5 volts negative with respect to earth and the potential of the point B is 5 volts negative with respect to earth. In this condition of the system, the oscillator circuit 1*a* will be operating, and a small additional bias voltage (say of 0.3 volt) will be developed across the resistor 13*a*, so that the mean potential of the base electrodes of the transistors 5*a* and 6*a* will be about 5.8 volts negative with respect to earth. Due to the flow of the emitter currents of the transistors 5*a* and 6*a* through the resistor 15, the emitter electrodes of the transistors 5*a* and 6*a* will be at a mean potential which is slightly less negative than that of the base electrodes of the transistors 5*a* and 6*a* (say 5.7 volts negative with respect to earth). The emitter electrodes of the transistors 5*b* and 6*b* will be at the same potential as the emitter electrodes of the transistors 5*a* and 6*a*, and will therefore be negative with respect to the base electrodes of the transistors 5*b* and 6*b*; consequently the transistors 5*b* and 6*b* will be cut off and the oscillator circuit 1*b* will be inoperative.

When the next transition occurs in the control voltages, the potential of the point A will change relatively slowly towards a value of 5 volts negative with respect to earth, and the potential of the point B will change relatively slowly towards a value of 5.5 volts negative with respect to earth. During the initial part of the transition, the oscillator circuit 1*a* will continue to operate at a substantially constant level and the oscillator circuit 1*b* will remain inoperative, the mean potential of the base electrodes of the transistors 5*a* and 6*a*, and consequently the mean potential of the emitter electrodes of these transistors, becoming less negative with respect to earth at substantially the same rate as the potential of the point A. At some instant during the transistion, after the potential at the point B has become more negative than that at the point A, the potential at the point B will become sufficiently more negative than the potential of the emitter electrodes of the transistors 5*b* and 6*b* for the oscillator circuit 1*b* to commence operating. Oscillations will build up rapidly in this circuit, particularly in view of the extra bias voltage which will then appear across the resistor 13*b*. At the same time the mean potential of the base electrodes of the transistors 5*b* and 6*b* will become rapidly more negative, and so, in consequence, will the mean potential of the emitter electrodes of the transistors 5*b* and 6*b*; the emitter electrodes of the transistors 5*a* and 6*a* will therefore rapidly be driven negative with respect to the base electrodes of these transistors, thus cutting off the transistors 5*a* and 6*a* and causing the oscillator circuit 1*a* to become inoperative. This effect is enhanced by the fact that the voltage appearing across the resistor 13*a* will drop to zero as the oscillator circuit 1*a* becomes inoperative. After the oscillator circuit 1*a* has become inoperative the mean potential of the base electrodes of the transistors 5*b* and 6*b* will continue to go more negative until the end of the transition in the control voltages, but the output of the oscillator circuit 1*b* will be maintained at a substantially constant level since the mean potential of the emitter electrodes of the transistors 5*b* and 6*b* will go more negative at substantially the same rate.

The transition between the steady states of the oscillator system in which the oscillator circuits 1*a* and 1*b* are respectively operative can thus be made very rapid, and it has been found possible in practice to achieve readily transition times as low as 300 microseconds. The use of windings 4*a* and 4*b* of a transformer for feeding voltages from the terminals 3*a* and 3*b* to the points A and B assists in achieving a rapid transition, and ensures that there is no tendency for the oscillator circuits 1*a* and 1*b* to jump back to their original state once a transition has started. It will be appreciated that once the oscillator circuit 1*b* is operating and the oscillator circuit 1*a* is inoperative, the system will continue in this condition until the next transition occurs in the control voltages, when the system will revert in a similar manner to that described above to the condition in which the oscillator circuit 1*a* is operating and the oscillator circuit 1*b* is inoperative.

A further point which should be noted, and which can be of value in certain applications of the system described above, is that if the system is operating in the absence of the control voltages, the potentials of the points A and B will be equal and in this condition of the system only one of the oscillator circuits 1*a* and 1*b* will operate. Thus, if this condition arises due to the cessation of the control voltages while the system is operating, the oscillator circuit which was last operative while the control voltages were present will continue to operate, and the other to remain inoperative; alternatively, if the system is switched on in the absence of the control voltages one of the oscillator circuits 1*a* and 1*b* will invariably start to operate before the other, causing an extra bias voltage to appear on the base electrodes of the transistors of the oscillator circuit which starts to operate first, thereby causing the emitter electrodes of all the transistors in the oscillator circuits 1*a* and 1*b* to be driven more negative, and thus ensuring that the transistors in the other oscillator circuit are held cut off.

In alternative arrangements to that described above, the oscillator system may include more than two oscillator circuits. Furthermore, the oscillator circuits need not be identical, but may for example be tuned to different frequencies.

An electric telegraph receiver utilising an electric oscillator system such as is described above is disclosed in the specification of copending patent application No. 661,629.

I claim:

1. An electric oscillator system comprising a plurality of oscillator circuits arranged to be selectively rendered operative by the application of suitable control voltages, said circuits having a common impedance element, each oscillator circuit comprising: a pair of electrical amplifying devices each having first and second input electrodes and an output electrode; a transformer having primary and secondary windings, the primary winding being connected between the output electrodes of the two amplifying devices and having a centre tapping arranged to be connected to one terminal of a constant voltage source, and the secondary winding being connected between the first input electrodes of the two amplifying devices; a capacitor connected across the primary winding; and a self-biassing arrangement constituted by a full wave rectifier circuit connected so as to rectify the alternating voltage appearing in operation across the secondary winding and so as to develop the rectified voltage in a sense corresponding to increased conduction of the amplifying devices between a centre tapping on the secondary winding and one of a pair of control terminals between which the control voltage for the oscillator circuit is arranged to be applied, the other of said pair of control terminals being arranged to be connected to a second terminal of the constant voltage source, the second input electrodes of the amplifying devices in all the oscillator circuits being connected together and to one end of the common impedance element, the other end of which is arranged to be connected to said second terminal of the constant voltage source.

2. An electric oscillator system according to claim 1 in which each electrical amplifying device is a transistor having base, emitter and collector electrodes, which respectively constitute said first and second input electrodes and said output electrode.

3. An electric oscillator system comprising a plurality of oscillator circuits arranged to be selectively rendered operative by the application of suitable control voltages, each oscillator circuit including an amplifier and a regenerative alternating current feedback path connected between the output and input of the amplifier, there being disposed in each oscillator circuit a pair of points between which a unidirectional voltage when applied will render the amplifier in that oscillator circuit in either a conducting condition or a cut off condition according to whether said unidirectional voltage respectively is of a first polarity or is of a second polarity opposite to the first polarity, each oscillator circuit further including a control circuit connected between said pair of points and comprising in series connection a first impedance element, a second impedance element and a pair of control terminals for the application of one of said control voltages, said first impedance element being individual to the particular oscillator circuit, said second impedance element being the same for, and being connected in like manner in, all the oscillator circuits and being connected to be supplied via any one of the amplifiers with a unidirectional current of a sense such that if any one of the amplifiers is in its conducting condition there is developed across said second impedance element a unidirectional voltage which is of said second polarity in respect of all the oscillator circuits, and each oscillator circuit further including rectifier means connected for rectifying part of the oscillatory output of that oscillator circuit to develop across said first impedance element of that oscillator circuit, when that oscillator circuit is operative, a unidirectional voltage of said first polarity.

4. An electric oscillator system according to claim 3 in which the control circuit in each oscillator circuit further includes an inductive winding connected in series with the first and second impedance elements and the pair of control terminals, all the inductive windings being inductively coupled to each other.

References Cited in the file of this patent

UNITED STATES PATENTS

| | | |
|---|---|---|
| 2,150,241 | Nichols et al. | Mar. 14, 1939 |
| 2,731,565 | Keizer et al. | Jan. 17, 1956 |
| 2,748,274 | Pearlman | May 29, 1956 |